(12) United States Patent
Kruit et al.

(10) Patent No.: US 12,062,519 B2
(45) Date of Patent: Aug. 13, 2024

(54) BEAM DEFLECTION DEVICE, ABERRATION CORRECTOR, MONOCHROMATOR, AND CHARGED PARTICLE BEAM DEVICE

(71) Applicant: Hitachi High-Tech Corporation, Tokyo (JP)

(72) Inventors: Pieter Kruit, Delft (NL); Hideto Dohi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 435 days.

(21) Appl. No.: 17/594,187

(22) PCT Filed: May 31, 2019

(86) PCT No.: PCT/JP2019/021843
§ 371 (c)(1),
(2) Date: Oct. 6, 2021

(87) PCT Pub. No.: WO2020/240861
PCT Pub. Date: Dec. 3, 2020

(65) Prior Publication Data
US 2022/0172920 A1 Jun. 2, 2022

(51) Int. Cl.
*H01J 37/147* (2006.01)
*H01J 37/12* (2006.01)
(Continued)

(52) U.S. Cl.
CPC .......... *H01J 37/1477* (2013.01); *H01J 37/12* (2013.01); *H01J 37/1475* (2013.01);
(Continued)

(58) Field of Classification Search
CPC ........ H01J 37/00; H01J 37/02; H01J 37/1477; H01J 37/12; H01J 37/1475; H01J 37/153;
(Continued)

(56) References Cited

U.S. PATENT DOCUMENTS

| | | | |
|---|---|---|---|
| 8,035,082 B2 | 10/2011 | Yamazaki et al. | |
| 2001/0052744 A1* | 12/2001 | Tsuno | H01J 37/05 313/364 |

(Continued)

FOREIGN PATENT DOCUMENTS

| | | |
|---|---|---|
| EP | 2 587 515 A1 | 5/2013 |
| JP | 2003-187730 A | 7/2003 |

(Continued)

OTHER PUBLICATIONS

International Search Report (PCT/ISA/210) issued in PCT Application No. PCT/JP2019/021843 dated Jul. 9, 2019 with English translation (three (3) pages).

(Continued)

*Primary Examiner* — Jason L McCormack
(74) *Attorney, Agent, or Firm* — Crowell & Moring LLP

(57) ABSTRACT

The present disclosure pertains to a beam deflection device capable of properly deflecting a beam. The present disclosure provides a beam deflection device for deflecting a beam inside a charged particle beam device, said beam deflection device being provided with: one or more electrostatic deflectors (207, 208) each having a pair of electrodes disposed so as to face each other across a beam path in a first direction orthogonal to the beam path; and one or more magnetic deflectors (209) each having a pair of magnetic poles disposed so as to face each other across the beam path in a second direction orthogonal to the beam path and to the first direction. When viewed from an incident direction of the beam, the one or more electrostatic deflectors and the one or more magnetic deflectors are stacked along the beam path such that the pair of electrodes at least partially overlap with the pair of magnetic poles and with a gap between the pair of magnetic poles.

23 Claims, 17 Drawing Sheets

(51) Int. Cl.
*H01J 37/153* (2006.01)
*H01J 37/28* (2006.01)

(52) U.S. Cl.
CPC ............ *H01J 37/153* (2013.01); *H01J 37/28* (2013.01); *H01J 2237/1516* (2013.01); *H01J 2237/1534* (2013.01)

(58) Field of Classification Search
CPC .. H01J 37/28; H01J 37/26; H01J 37/05; H01J 37/1471; H01J 2237/1516; H01J 2237/1534; H01J 2237/057
USPC .............. 250/306, 307, 311, 396 R, 396 ML
See application file for complete search history.

(56) References Cited

U.S. PATENT DOCUMENTS

| | | | |
|---|---|---|---|
| 2009/0039281 A1* | 2/2009 | Kawasaki | H01J 37/26 250/311 |
| 2012/0261565 A1 | 10/2012 | Tuggle et al. | |
| 2013/0256530 A1* | 10/2013 | Jiang | H01J 37/153 250/307 |
| 2016/0329189 A1* | 11/2016 | Sears | H01J 37/28 |
| 2018/0040452 A1 | 2/2018 | Hatakeyama et al. | |
| 2019/0259564 A1* | 8/2019 | Kruit | H01J 37/1475 |

FOREIGN PATENT DOCUMENTS

| | | |
|---|---|---|
| JP | 2012-227140 A | 11/2012 |
| TW | 201640554 A | 11/2016 |
| WO | WO 2018/016961 A1 | 1/2018 |

OTHER PUBLICATIONS

Japanese-language Written Opinion (PCT/ISA/237) issued in PCT Application No. PCT/JP2019/021843 dated Jul. 9, 2019 (three (3) pages).

Taiwanese-language Office Action issued in Taiwanese Application No. 109117459 dated Mar. 25, 2021 (three (3) pages).

* cited by examiner

BEAM DEFLECTION DEVICE, ABERRATION CORRECTOR, MONOCHROMATOR, AND CHARGED PARTICLE BEAM DEVICE

TECHNICAL FIELD

The present disclosure relates to a beam deflection device, as well as an aberration corrector, a monochromator, and a charged particle beam device including the beam deflection device, such as a beam deflection device in which an electrode and a magnetic pole can be arranged close to a beam trajectory, as well as an aberration corrector, a monochromator, and a charged particle beam device including the referenced beam deflection device.

BACKGROUND ART

A lens used in a charged particle beam device such as an electron microscope focuses a beam by generating an electrostatic field or a magnetic field. A trajectory of an electron or the like in an electron lens actually does not form a perfect image and offsets from a trajectory assuming a perfect image formation. Particularly, a spherical aberration and a chromatic aberration are factors of reducing a resolution of the electron microscope and the like. To suppress such an aberration, an aberration corrector including an electron mirror is known.

Patent Literature 1 discloses an aberration corrector in which a first electron mirror and a second electron mirror are arranged with an intermediate space between them. The referenced aberration corrector includes a Wien filter that deflects an electron beam deflected away from an optical axis of an electron microscope toward the first mirror, the referenced Wien filter being configured to guide the electron beam to the second mirror so that a trajectory of the beam reaching the second mirror is positioned on an extension line of the trajectory of the beam reflected by the first mirror, and to deflect the electron beam reflected by the second mirror back to the optical axis of the electron microscope. Since the first mirror and the second mirror are configured to provide the electron beam with an aberration that offsets the aberration, it is possible to suppress the aberration generated in the electron microscope.

Patent Literature 2 describes providing two pairs of electrodes and a pair of magnetic poles for guiding secondary electrons to a detector side without deflecting the electron beam and generating an electric field and a magnetic field for guiding the secondary electrons to the detector installed between the two pairs of electrodes.

CITATION LIST

Patent Literature

Patent Literature 1: WO2018/016961
Patent Literature 2: Japanese Unexamined Patent Application Publication No. 2003-187730

SUMMARY OF INVENTION

Technical Problem

As disclosed in Patent Literature 1, it is possible to control the trajectory of the electron beam after entering an aberration corrector and before exiting it by arranging the Wien filter in the aberration corrector. With the configuration disclosed in Patent Literature 1, however, it is difficult to bring the electrodes and the magnetic poles for generating the electric field and the magnetic field close to the beam trajectory. This is because both of the electrodes and the magnetic poles need to be spaced away from the beam trajectory so as not to interfere with each other since surfaces of the electrodes and the magnetic poles facing the beam trajectory have a predetermined size. To install the deflector that deflects the beam trajectory in a limited space, it is desired to arrange the electrodes and the magnetic poles close to the beam trajectory.

Moreover, Patent Literature 2 discloses a beam separator having two pairs of electrodes and a pair of magnetic poles arranged so that the electric field is orthogonal to the magnetic field. However, no discussion is made as to a means of arranging the electrodes and magnetic poles close to the beam trajectory.

In the light of such a situation, the present disclosure proposes a configuration of a beam deflection device in which an electrode and a magnetic pole are arranged close to a beam trajectory, as well as an aberration corrector, a monochromator, and a charged particle beam device including the referenced beam deflection device.

Solution to Problem

As one aspect to solve the above-described problem, the present disclosure proposes a beam deflection device for deflecting abeam in a charged particle beam device, including: one or more electrostatic deflectors including a pair of electrodes arranged to sandwich therebetween a beam trajectory in a first direction orthogonal to the trajectory of the beam; and one or more magnetic field deflectors including a pair of magnetic poles arranged to sandwich therebetween the beam trajectory in a second direction orthogonal to the trajectory of the beam and the first direction, in which the one or more electrostatic deflectors and the one or more magnetic field deflector are stacked along the trajectory of the beam so that at least a portion of the pair of electrodes overlap the pair of magnetic poles as seen from an incident direction of the beam, as well as an aberration corrector, a monochromator, and a charged particle beam device including the referenced beam deflection device.

Additional features associated with the present disclosure will be apparent from the present description and accompanying drawings. Moreover, aspects of the present disclosure can be achieved and implemented according to modes of elements and various combinations elements, as well as the detailed description and the scope of the claims that follow.

The description herein is merely a typical example, and does not limit the scope of the claims or application examples in any meanings.

Advantageous Effects of Invention

According to the present disclosure, it is made possible to provide a beam deflection device in which an electrode and a magnetic pole can be arranged close to a trajectory of a beam, as well as an aberration corrector, a monochromator, and a charged particle beam device including the referenced beam deflection device.

DESCRIPTION OF EMBODIMENTS

Figure 1:
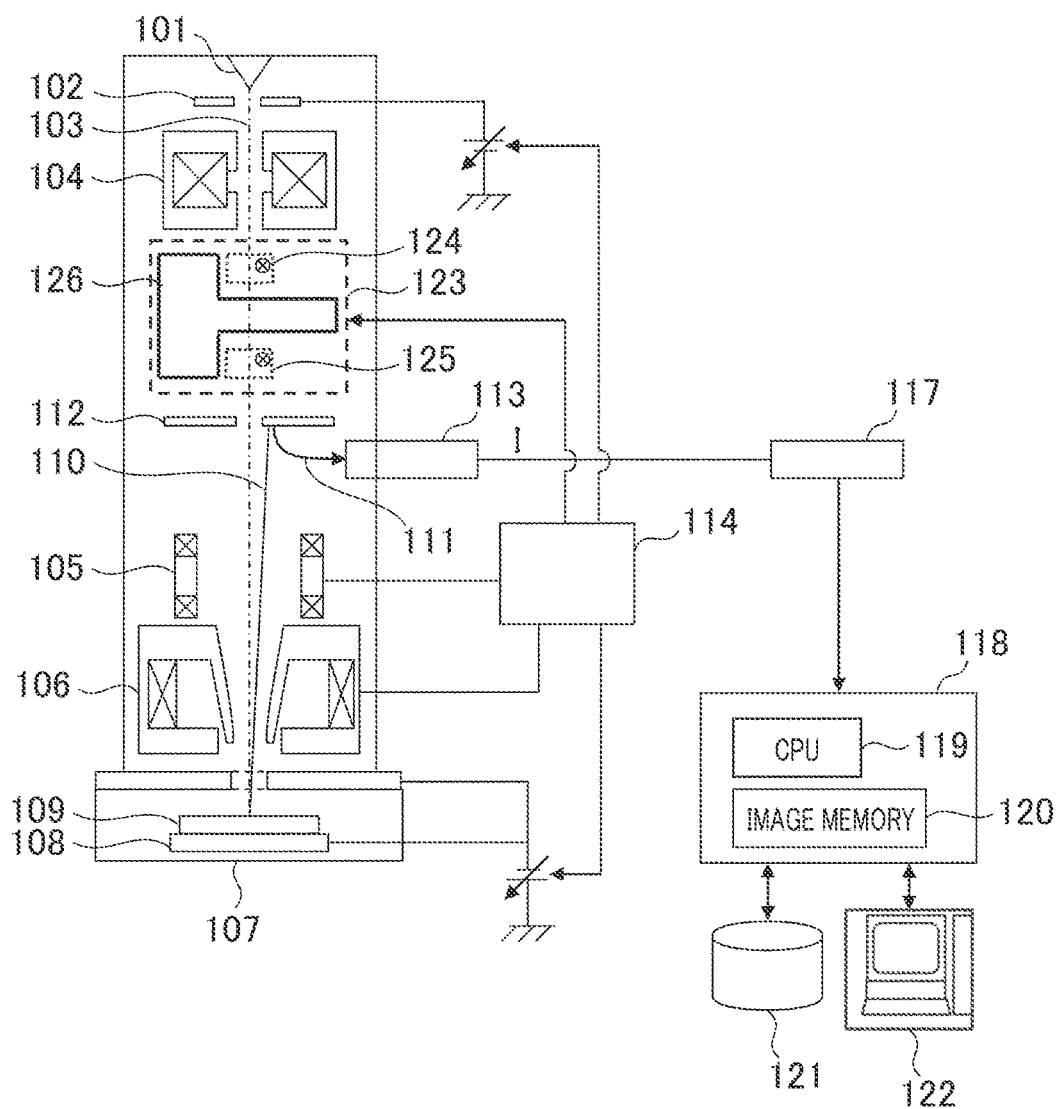
FIG. 1 shows a schematic configuration example of a scanning electron microscope including an aberration corrector.

In the following, embodiments of the present disclosure are described with reference to drawings. In the accompanying drawings, the functionally same elements may be denoted by the same reference numerals. It is to be noted that the accompanying drawings present specific embodiments in accordance with the principle of the present disclosure, which are for the purpose of understanding of the present disclosure and not to be used to translate the present disclosure in a limiting manner.

Moreover, it should be understood that, while the present embodiment describes the present disclosure in enough detail for those skilled in the art to implement the present disclosure, other implementations/embodiments are also possible, and it is possible to modify the configuration/structure and replace various elements without departing from the scope and the spirit of the technical concept of the present disclosure. Accordingly, the following description should not be understood to be limited thereto.

<Configuration Example of Scanning Electron Microscope>

FIG. 1 shows a schematic configuration example of a scanning electron microscope (SEM: Scanning Electron Microscope) including an aberration corrector. An electron beam is extracted from a tip 101 by an extraction electrode 102, and accelerated by an acceleration electrode and an acceleration tube that are not shown. The accelerated electron beam passes through an ideal optical axis 103, is narrowed by a condenser lens 104 that is one type of a focusing lens, and then deflected by a scanning deflector 105. This allows the electron beam to scan a sample 109 in one dimension or two dimensions.

The electron beam entering the sample 109 is decelerated by negative voltage applied to an electrode built in a sample stage 108, focused by the lens effect of an objective lens 106, and irradiates a surface of the sample 109. The sample stage 108 is arranged in a vacuum sample chamber 107.

Electrons 110 (secondary electrons, backscattered electrons, and the like) are emitted from the irradiated site on the sample 109. The emitted electrons 110 are accelerated in the direction of the tip (electron source) 101 by the acceleration effect based on the negative voltage applied to the electrode built in the sample stage 108.

The accelerated electrons 110 impinge on a conversion electrode 112 and generate secondary electrons 111. The secondary electrons 111 emitted from the conversion electrode 112 are captured by a detector 113, and an output I of the detector 113 changes depending on an amount of the captured secondary electrons. Luminance of a display apparatus changes in accordance with the change of the output I. For example, in a case of forming a two-dimensional image, an image of a scanning region is formed by synchronizing a deflected signal to the scanning deflector 105 with the output I of the detector 113. It is to be noted that, although the SEM illustrated in FIG. 1 shows an example of detecting the electrons 110 emitted from the sample 109 after being converted to the secondary electrons 111 at the conversion electrode 112, the present disclosure is naturally not limited to such a configuration. For example, a configuration may be adopted that includes an electronic zoom image tube or a detection surface of the detector arranged on the trajectory of the accelerated electrons.

A control device 114 supplies to a necessary control signal each optical element in the above-described SEM according to an operation program referred to as an imaging recipe for controlling the SEM.

The signal detected by the detector 113 is then converted to a digital signal by an A/D converter 117 and transmitted to an image processing part 118. The image processing part 118 generates an integrated image by integrating signals obtained by a plurality of scans with respect to each frame.

Now, an image obtained by a single scan on the scanning region is referred to as one frame of image. For example, when integrating eight frames of image, the integrated image is generated by addition averaging the signals obtained from eight secondary scans with respect to each pixel. It is also possible to scan an identical scanning region for more than once and generate a plurality of single-frame images with respect to each scan to be stored.

Furthermore, the image processing part 118 includes an image memory 120 that is an image storage medium for temporarily storing the digital image and a CPU 119 that calculates a feature amount (e.g., a dimension value of a line or a hole, a roughness index value, an index value indicative of a pattern shape, an area value of the pattern, a pixel position to be an edge position) from the image stored in the image memory 120.

The image processing part 118 also includes a storage medium that stores therein measured values of each pattern, luminance values of each pixel, and the like. The total control is performed by a workstation 122. Necessary operations of the device, check of detection results, and the like can be performed using a graphical user interface. The image memory 120 is configured to synchronize a scanning signal supplied to the scanning deflector 105 and store an output signal from the detector (signal proportional to a quantity of electrons emitted from the sample) on an address (x, y) on a corresponding memory. Moreover, the image processing part 118 functions as an arithmetic processing unit that generates a line profile from the luminance value stored in the image memory 120, identify the edge position using the threshold scheme or the like, and measure a dimension between the edges.

Such an SEM that performs dimensional measurement on the basis of line profile acquisition is referred to as a CD-SEM, and used to measure various feature amounts in addition to measurement of a line width on a semiconductor circuit. For example, there is a roughness referred to as a line edge roughness on an edge of the above-described circuit pattern, which is a factor of changing the circuit performance. The CD-SEM can be used for measurement of the above-described LER.

It is to be noted that, although the scanning electron microscope that is one type of the charged particle beam device is mentioned in the present embodiment, the aberration corrector described below is also applicable to a charged particle beam device such as an ion microscope or a focused ion beam (FIB: Focused Ion Beam) that emits hydrogen ion, helium ion, or liquid metal such as gallium other than the scanning electron microscope.

<Configuration Example and Operation Outline of Aberration Corrector>

A scanning electron microscope 1 illustrated in FIG. 1 is provided with an aberration corrector 123 for suppressing aberration generated by an optical element such as a lens. The aberration corrector 123 includes a magnetic field deflector 124 for bringing (deflecting) the electron beam off from the ideal optical axis 103 of the scanning electron microscope, an aberration correction unit 126 for correcting the aberration of the off-axis electron beam, and a magnetic field deflector 125 that deflects a trajectory of the electron beam emitted from the aberration correction unit 126 to align with the ideal optical axis 103 of the electron beam.

Figure 2:
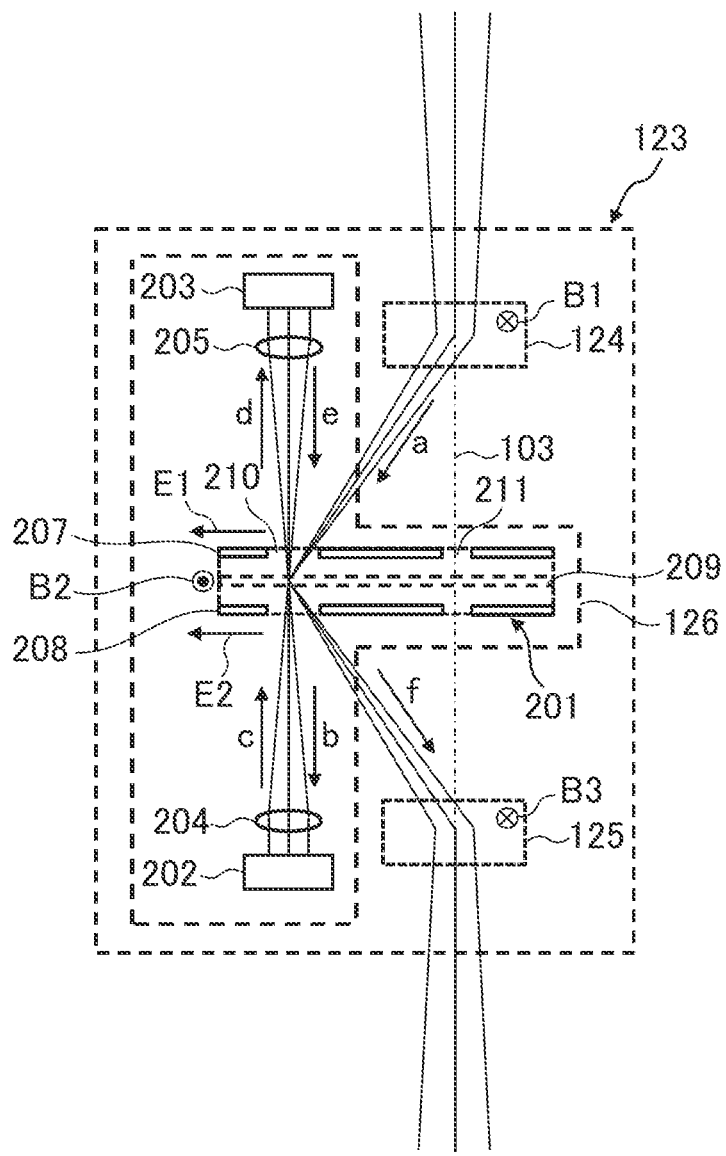
FIG. 2 shows an outline of a double mirror aberration corrector.

FIG. 2 shows a specific configuration example of the aberration corrector 123. The aberration correction unit 126 includes a double mirror aberration corrector. The referenced double mirror aberration corrector includes a first electron mirror 202 and a second electron mirror 203 arranged with a predetermined intermediate space between them.

The electron beam entering the magnetic field deflector 124 arranged in the aberration corrector 123 is deflected to a direction a by a magnetic field B1 of the magnetic field deflector 124 and enters an orthogonal electromagnetic field generation unit 201. The electron beam having entered the orthogonal electromagnetic field generation unit 201 is deflected in a direction b by a deflected electromagnetic field generated by the orthogonal electromagnetic field generation unit 201 and travels toward the first electron mirror 202.

The first electron mirror 202 is biased with a voltage equal to the energy reached by the incident electron beam. Therefore, the electrons are decelerated by the electron mirror and reflected by an equipotential surface on which kinetic energy of the electrons reaches zero. Hence, the equipotential surface on which the kinetic energy of the individual electrons reaches zero provides a reflection surface for these electrons. By curving the equipotential surface, it is possible to introduce a negative spherical aberration and a negative chromatic aberration to the reflected electron beam arranged at least partially to compensate for the aberration of the electron microscope lens.

The reflected electron beam reflected in a direction c by the first electron mirror 202 passes through the orthogonal electromagnetic field generation unit 201 and travels toward the second electron mirror 203. It is to be noted that a deflection condition is adjusted so that the orthogonal electromagnetic field generation unit 201 may not deflect the trajectory of the reflected electron beam reflected by the first electron mirror 202. Specifically, in the orthogonal electromagnetic field generation unit 201 illustrated in FIG. 2, the deflection condition of each deflector is adjusted so that the deflection effect of electrostatic deflectors 207, 208 on two upper and lower stages and the deflection effect of a magnetic field deflector 209 arranged between the electrostatic deflectors 207, 208 are offset by each other. Accordingly, the direction c and a direction d are the same direction.

The electron beam having passed through the orthogonal electromagnetic field generation unit 201 is reflected toward a direction e by the second electron mirror 20, and enters the orthogonal electromagnetic field generation unit 201 again. The aberration correction unit 126 functions as the aberration corrector by generating an aberration that compensates for the aberration of the electron beam with at least one of the first electron mirror 202 and the second electron mirror 203.

The electron beam reflected by the second electron mirror 203 and entering the orthogonal electromagnetic field generation unit 201 is deflected in a direction f by the orthogonal electromagnetic field generation unit 201 and travels toward the ideal optical axis 103 of the scanning electron microscope. The magnetic field deflector 125 is arranged at an intersection of the electron beam trajectory and the ideal optical axis 103. A magnetic field B3 generated by the magnetic field deflector 125 has predetermined energy, and is adjusted to deflect the electron beam traveling toward the direction f to the direction of the ideal optical axis 103, and the magnetic field deflector 125 functions to return the electron beam with its aberration compensated by the aberration correction unit 126 to the ideal optical axis 103 of the scanning electron microscope.

Lenses 204 and 205 are adjusted to collimate the beam entering each electron mirror to a parallel beam and so that the beam reflected by each electron mirror focuses on the magnetic field deflector 209. The beam having entered each electron mirror has its aberration compensated by being reflected by an electric field having a voltage distribution that offsets the aberration on the electron mirror.

It is to be noted that the orthogonal electromagnetic field generation unit 201 includes an aperture 210 through which the electron beam passes when the aberration correction is performed using the aberration correction unit 126 and an aperture 211 through which the electron beam passes when the aberration correction unit 126 is not used (the aberration correction is not performed). The control device 114 uses either of the two apertures appropriately by switching between "on" of the aberration correction function by supplying the magnetic field deflectors 124 and 125 and the aberration correction unit 126 with predetermined voltage and current and "off" of the aberration correction function by not supplying current to the magnetic field deflectors 124, 125. Moreover, although FIG. 2 is described with an example of using the two magnetic field deflectors 124, 125 to deflect the beam out of the optical axis and deflect the beam incident from the outside of the axis so as to pass through the optical axis, the beam may be deflected by the electrostatic deflector or the Wien filter.

<Specific Structure Example of Orthogonal Electromagnetic Field Generation Unit 201>

Figure 3:
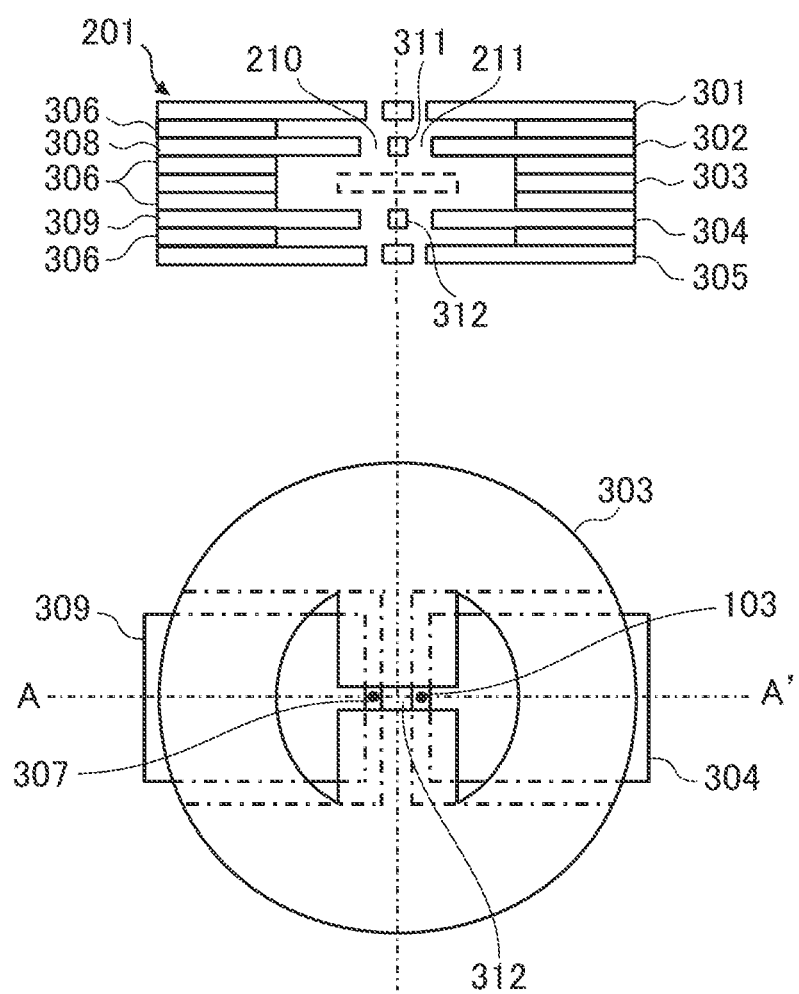
FIG. 3 shows an outline of an orthogonal electromagnetic field generation unit included in the double mirror aberration corrector.

FIG. 3 illustrates a specific structure (one example) of the orthogonal electromagnetic field generation unit 201. The orthogonal electromagnetic field generation unit 201 illustrated in FIG. 3 includes a magnetic pole plate 303 constituting the magnetic field deflector 209, a pair of electrodes 302 and 308 constituting the electrostatic deflector 207, and a pair of electrodes 304 and 309 constituting the electrostatic deflector 208. The lower part of FIG. 3 shows a positional relation between the magnetic pole plate 303 and a pair of electrodes 304 as seen from the second electron mirror 203 side. The upper part of FIG. 3 shows a cross section of the orthogonal electromagnetic field generation unit 201 taken along A-A'.

Figure 4A:
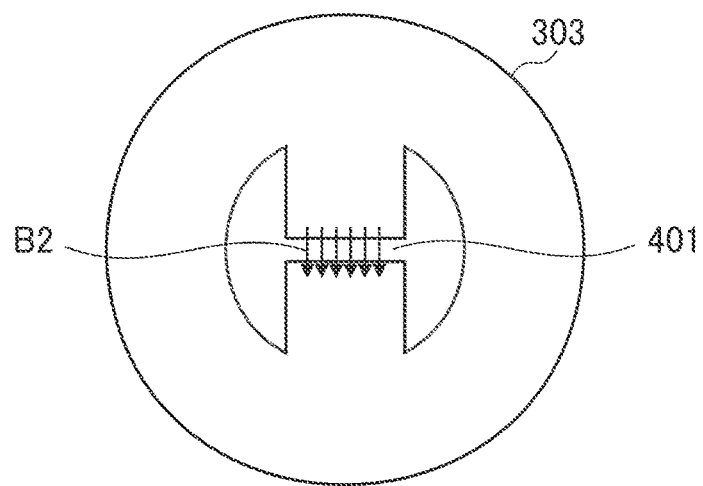
FIGS. 4A and 4B show shapes of an electrode and a magnetic pole that constitute the orthogonal electromagnetic field generation unit.
Figure 4B:
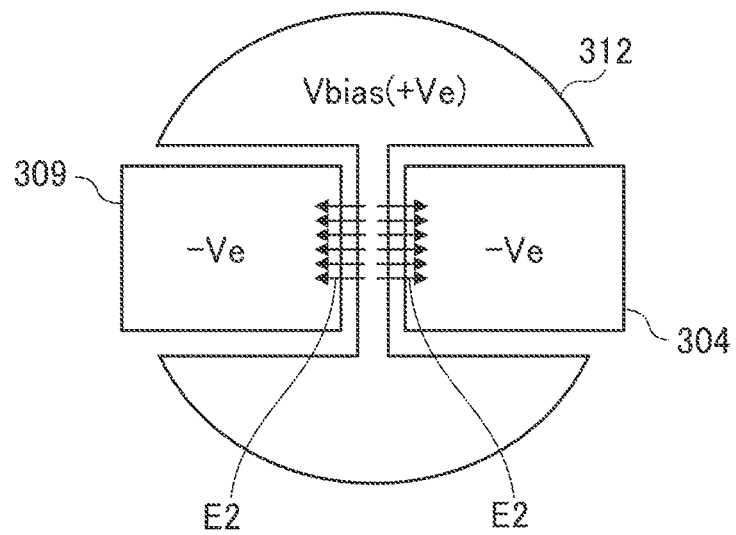

The magnetic pole plate 303 is made of a magnetic material, has a gap 401 as illustrated in FIG. 4(a), and is configured to generate a magnetic field (B2) in the referenced gap in a direction of an arrow. For example, the magnetic pole plate 303 is configured to generate the magnetic field in the gap 401 by winding a coil around a portion thereof. On the other hand, as illustrated in FIG. 4(b), the electrostatic deflector 208 includes an intermediate electrode 312 in addition to the pair of electrodes 304, 309. The configuration allowing for applying −Ve to the electrode 309 and applying +Ve to the intermediate electrode 312 generates an electric field E2 between the electrodes.

The pair of electrodes 302 and 308, an intermediate electrode 311, the magnetic pole plate 303, the pair of electrodes 304 and 309, and the intermediate electrode 312 are guided by an unshown jig and stacked as illustrated in the upper part of FIG. 3. Moreover, an insulating spacer 306 is arranged between the pair of electrodes 302 and 308 constituting the intermediate electrode 311 and the first electrostatic deflector 207 and the magnetic field deflector 209, and the referenced spacer 306 insulates between them. At the same time, the electric field generated by the electrostatic deflector 207 and the magnetic field generated by the magnetic field deflector 209 are maintained at a distance long enough not to superimpose each other in a z direction (the same direction as the ideal optical axis of the beam). It is to be noted that the two may be insulated by using a support member that supports the electrodes and the magnetic poles in a non-contact manner instead of the spacer.

The spacers 306 are also arranged between the magnetic pole plate 303 and the intermediate electrode 312 and the pair of electrodes 304 and 309. This configures a three-stage deflector (E-B-E unit) including an electric field (E), a magnetic field (B), and an electric field (E), the two deflected electrostatic fields and one deflected magnetic field not superimposing one another in the z direction.

Furthermore, as illustrated in the lower part of FIG. 3, the orthogonal electromagnetic field generation unit 201 forms the electric field E and the magnetic field B so as to deflect a beam passing through the ideal optical axis 103 of the electron microscope and an electron beam trajectory 307 between the first electron mirror 202 and the second electron mirror 203. Moreover, as illustrated in the upper part of FIG. 3, the E-B-E unit configures a single orthogonal electromagnetic field generation unit along with lids 301, 305 on two upper and lower stages to be guided by an unshown jig. The lids 301, 305 are provided with two apertures, respectively, so as to secure the ideal optical axis 103 through which the beam passes when the aberration correction is not performed and the trajectory 307 through which the beam passes when the aberration correction is performed.

The E-B-E unit as illustrated in FIGS. 3 and 4 is constituted by a plurality of deflectors located at a plurality of different heights (arranged at different positions in an irradiation direction of the beam). Such a configuration makes it possible to perform a proper trajectory adjustment without using a minute deflector. Moreover, it is made possible to perform the proper trajectory adjustment regardless of tolerance of the apparatus by stacking plate-like electrodes and magnetic poles as in the present embodiment and also making independently adjustable the signals supplied to the deflectors on a plurality of stages. In this manner, with a relatively simple configuration of stacking the plate-like electrodes and magnetic poles, it is possible to achieve highly precise aberration correction without causing high-order aberration.

<Relation Between Electric Field and Magnetic Field and Beam Trajectory when Aberration Correction is Performed>

Figure 5:
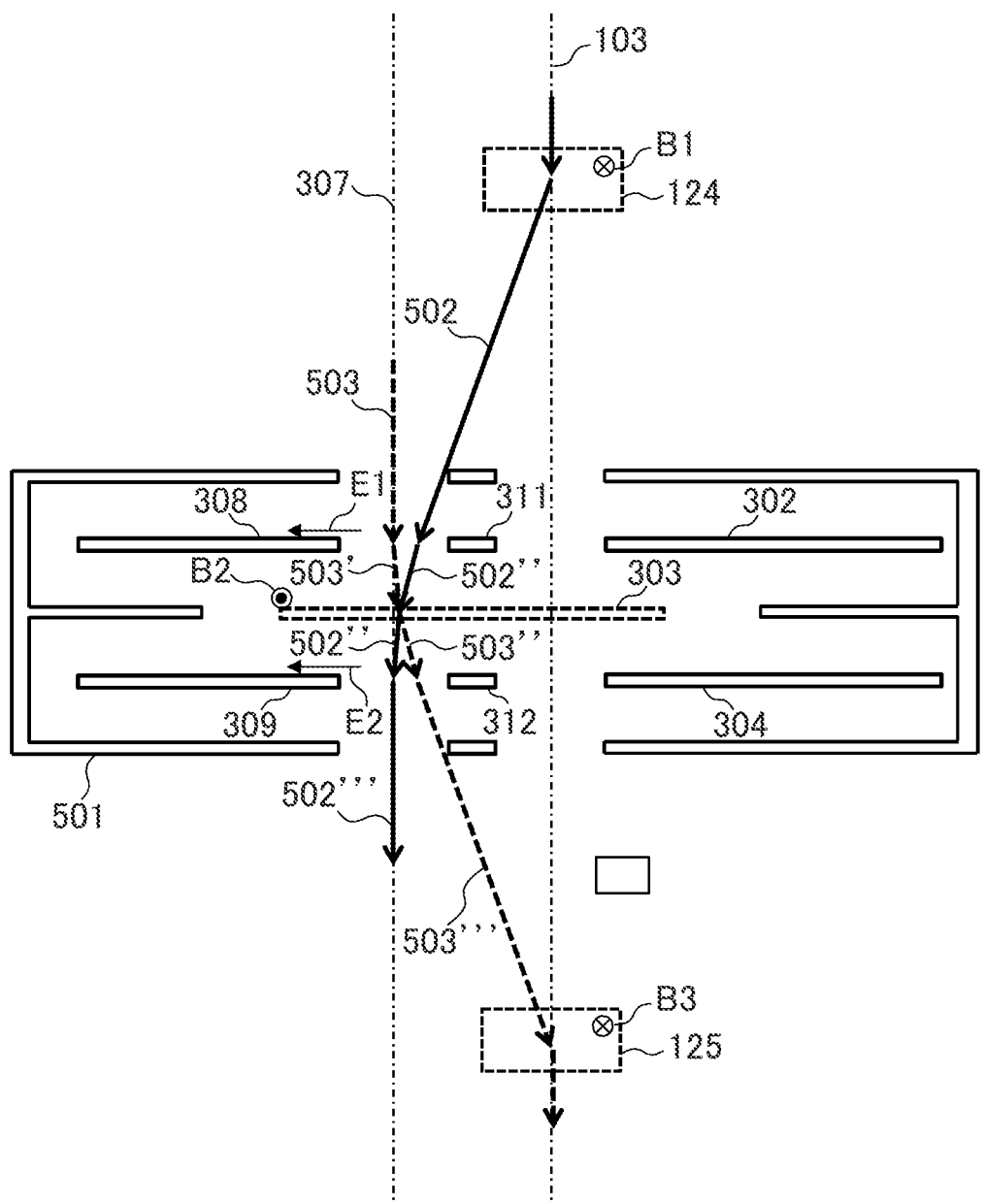
FIG. 5 shows a relation between the orthogonal electromagnetic field generation unit and a beam trajectory.

FIG. 5 shows a relation between the electric field and the magnetic field generated by the E-B-E unit and the trajectory of the beam. First, the beam passing through the ideal optical axis 103 of the electron microscope is deflected to a trajectory 502 by the magnetic field B1 generated by the magnetic field deflector 124. The beam deflected by the trajectory 502 is deflected (toward the right side of the page) so as to pass through a trajectory 502' by an electric field E1 (electric field generated by the first electrostatic deflector).

The beam passing through the trajectory 502' is then deflected (toward the right side of the page) so as to pass through a trajectory 502" by the magnetic field B2 (magnetic field generated by the magnetic field deflector). The beam through the trajectory 502" is further deflected (toward the right side of the page) so as to pass through a trajectory 502'" (the beam trajectory 307 between two mirrors) by the electric field E2 (electric field generated by a second electrostatic deflector).

As described above, the beam deflected from the ideal optical axis 103 by the three deflection fields of E, B, and E is deflected to align with the beam trajectory 307 in the aberration corrector. The beam deflected to pass through the beam trajectory 307 is reflected by the electron mirror 202 illustrated in FIG. 1, passes through the beam trajectory 307 again, and enters the E-B-E unit. Although the beam is deflected toward the right side of the page by the electric field E2 at this time, it is deflected oppositely by the magnetic field B2 (deflected toward the beam trajectory 307) and further deflected by the electric field E1 to align with the beam trajectory 307.

Voltage applied to and current supplied to the E-B-E unit are adjusted to deflect the beam entering through the trajectory 502 so as to pass through the beam trajectory 307. Moreover, the referenced voltage and current are adjusted so that the beam reflected by the first electron mirror 202 and entering the E-B-E unit through the beam trajectory 307 passes through the beam trajectory 307 and reaches the second electron mirror 203 regardless of the deflected electric field or deflected magnetic field.

The beam reflected by the second electron mirror 203 and entering the E-B-E unit again after passing through a trajectory 503 is deflected (toward the right side of the page) by the electric field E1 out of the beam trajectory 307 so as to pass through a trajectory 503'. The beam passing through the trajectory 503' is then deflected (toward the right side of the page) by the magnetic field B2 so as to pass through the trajectory 503". The beam passing through the trajectory 503" is further deflected (toward the right side of the page) by the electric field E2 so as to pass through a trajectory 503'".

The beam passing through the trajectory 503'" is deflected toward the left side of the page by the magnetic field B3 generated by the magnetic field deflector 125. The magnetic field B3 is adjusted to an intensity that allows the beam passing through the trajectory 503'" to pass through the ideal optical axis 103.

<Relation Between Electric Field and Magnetic Field and Beam Trajectory when Aberration Correction is not Performed>

Figure 6:
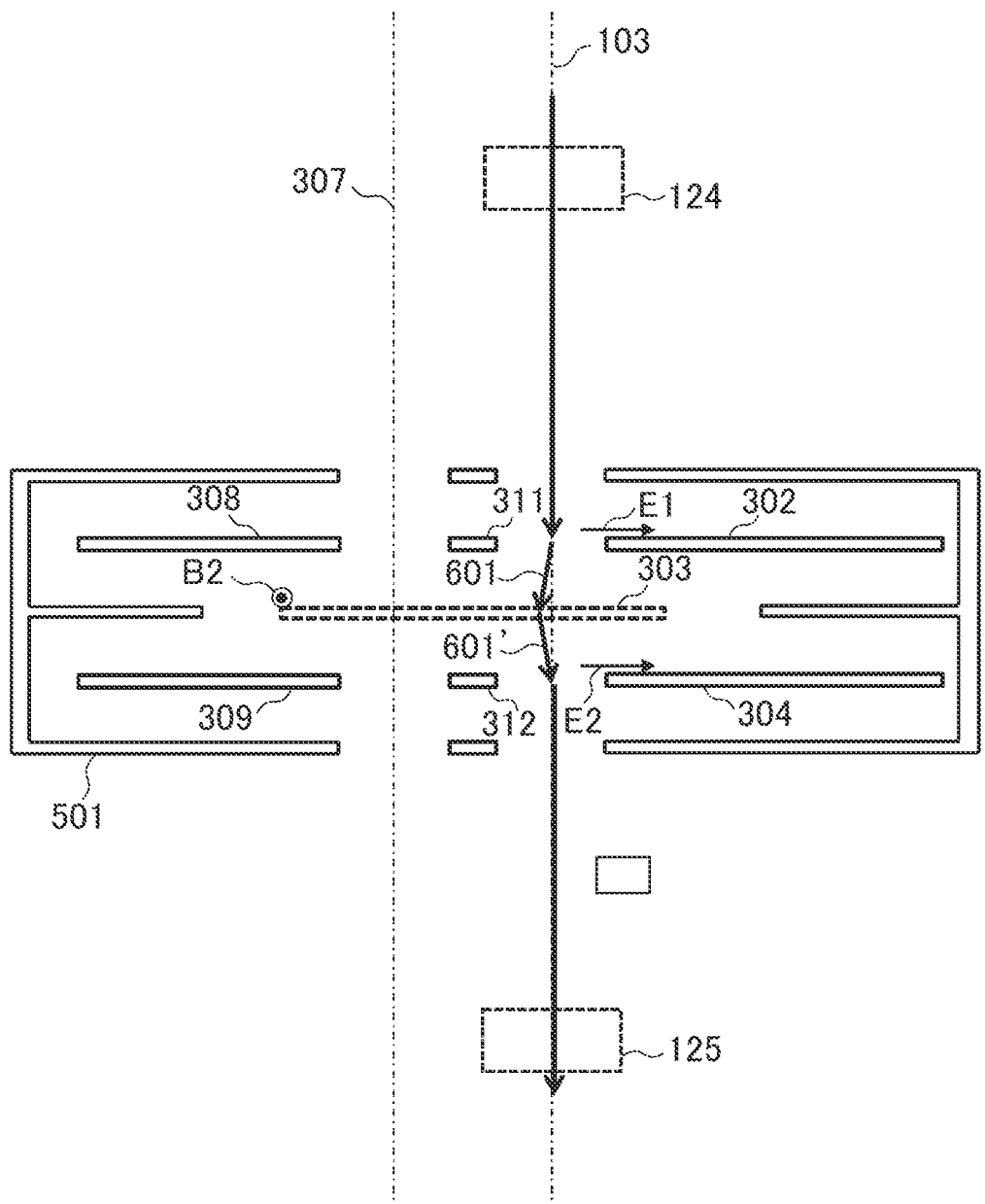
FIG. 6 shows a relation between the orthogonal electromagnetic field generation unit and the beam trajectory.

FIG. 6 illustrates a beam trajectory in a case where the aberration correction is not performed using the aberration correction unit 126. As described above, by turning the magnetic field deflectors 124 and 125 off, the beam enters the E-B-E unit through the ideal optical axis 103 without being deflected. The electron beam having entered the E-B-E unit is deflected by the electric field E1 (toward the left side of the page) so as to pass through a trajectory 601.

The beam passing through the trajectory 601 is then deflected (toward the right side of the page) by the magnetic field B2 so as to pass through a trajectory 601'. The beam passing through the trajectory 601' is deflected (toward the left side of the page) by the electric field E2 so as to pass through the ideal optical axis 103 and passes through the E-B-E unit. According to the E-B-E unit as illustrated in FIG. 6, regardless of whether the aberration correction is performed or not, current continues to be supplied to a coil. It is thus possible to stabilize temperature of the coil and the magnetic material in a thermal equilibrium state. It is also possible to avoid occurrence of magnetic hysteresis in the magnetic material.

It is to be noted that the Wien filter deflects a beam traveling in a predetermined direction, whereas the Wien filter does not deflect other beams traveling in a direction opposite from the predetermined direction. Therefore, it is necessary to have the electric field and the magnetic field cross each other at aright angle and adjust the electric field and the magnetic field appropriately, but it is difficult to arrange the electrodes and the magnetic poles in a limited space at the same height.

On the other hand, as illustrated in FIG. 3 and the like, by stacking the electrodes and the magnetic poles not at the same height but at different heights (configured so that the electrodes and the magnetic poles partially overlap) and also configuring the orthogonal electromagnetic field so that the electric field and the magnetic field are orthogonal to the beam trajectory, it is possible to form the electrodes and the magnetic poles with a relatively simple structure/configuration in a minute space. Moreover, according to the electrode shape and the magnetic pole shape as illustrated in FIG. 3, it is possible to form the electromagnetic field orthogonal to the beam trajectory 307 while securing the beam trajectory 307 when the aberration corrector is used and the beam trajectory when the aberration corrector is not used (ideal optical axis 103).

<Positional Relation Between Beam Passage Aperture and Electric Field and Magnetic Field>

FIG. 8(*a*) illustrates a positional relation between the electric field E and the magnetic field B generated by the E-B-E unit and a beam passage aperture 801 formed by stacking the electrodes and the magnetic poles generating these electric field and magnetic field (generation region of the electric field or the magnetic field). The electrodes and the magnetic poles are stacked in the form of # (double cross: Number sign) with a clearance in the center to be a passage aperture for the beam. As illustrated in the present embodiment, by stacking the pair of electrodes and the magnetic poles of the electrostatic deflector and the magnetic field deflector constituted by the pair of electrodes and the magnetic poles with the diagonal direction of the pair of electrodes and the magnetic poles offset by a predetermined angle (e.g., 90 degrees in the present embodiment), it is possible to bring the beam trajectory close to the electrodes and the beam trajectory close to the magnetic poles without preparing a minute structure.

FIGS. 8(*b*), 8(*c*), and 8(*d*) respectively show a beam trajectory when the beam enters the E-B-E unit from the ideal optical axis 103 of the electron microscope, a beam trajectory as the beam reflected by the first electron mirror 202 travels toward the second electron mirror 203, and a beam trajectory when the beam reflected by the second electron mirror travels back to the ideal optical axis 103 via the E-B-E unit. As illustrated in FIGS. 8(*b*), 8(*c*), and 8(*d*), the deflection condition is adjusted so that a deflection angle (2θ) of the magnetic field deflector is two times larger than the deflection angle (θ) of the magnetic field deflector.

<Other Configuration Examples of E-B-E Unit>

Figure 7:
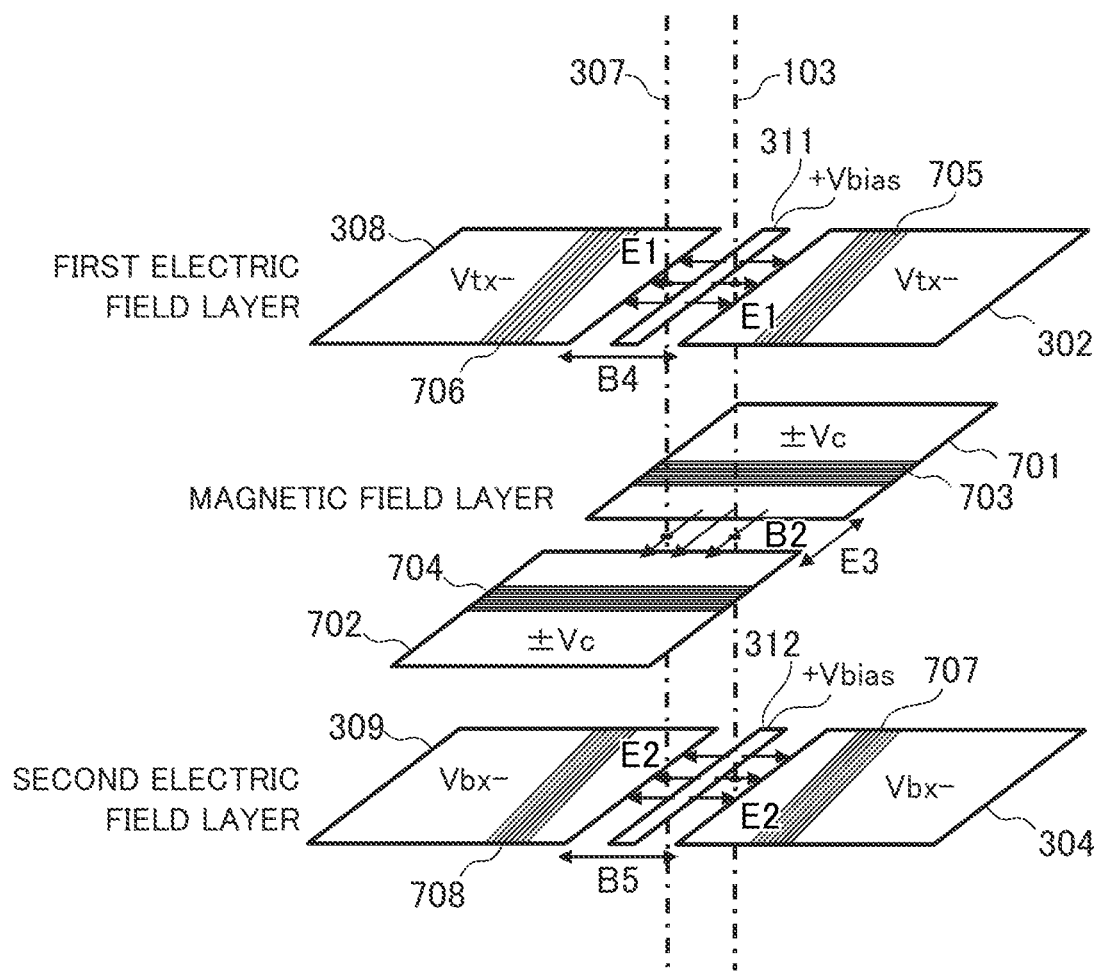
FIG. 7 illustrates another configuration of the orthogonal electromagnetic field generation unit.
Figure 8A:
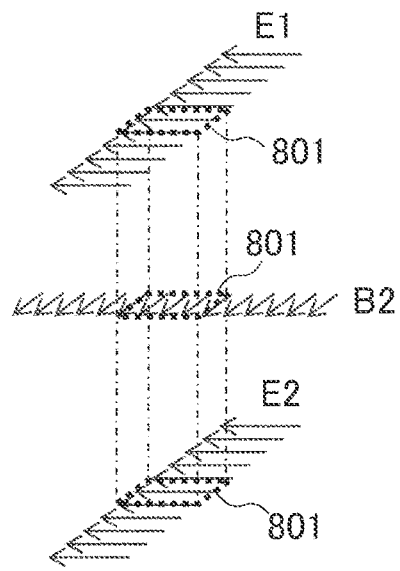
FIGS. 8A-8D illustrate an electric field E and a magnetic field B generated by the orthogonal electromagnetic field generation unit, and a trajectory of a beam deflected by the electric field and the magnetic field.
Figure 8B:
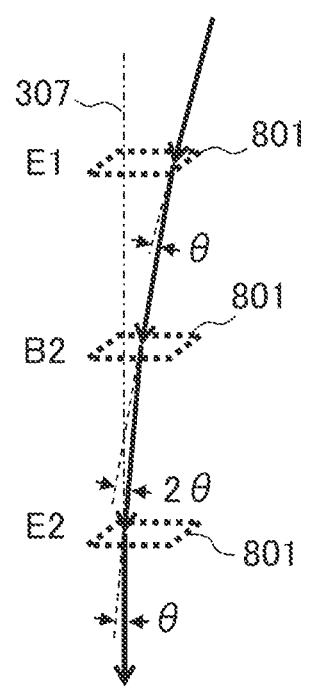
Figure 8C:
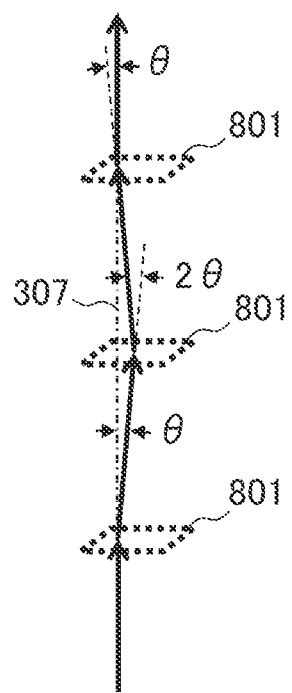
Figure 8D:
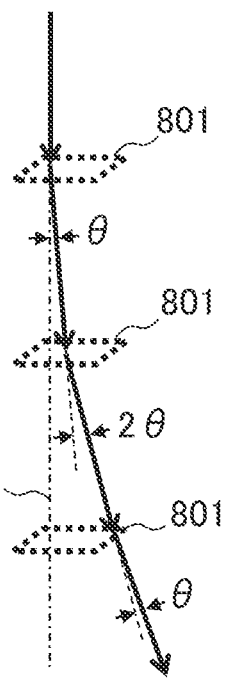

FIG. 7 shows another configuration example of the E-B-E unit. As shown in FIG. 7, magnetic poles 701 and 702 constituting the magnetic field deflector 209 (magnetic field layer) are respectively wound with coils 703 and 704 for generating the magnetic field B2. Here, there is described the E-B-E unit that includes an unshown voltage application power source for generating an electric field E3 between the magnetic pole 701 and the magnetic pole 702.

With the referenced configuration, by applying voltage to the magnetic pole 701 and the magnetic pole 702 so as to form an electric field between the magnetic poles, it is possible to generate the electric field E3 in the same direction as the magnetic field B2. Moreover, the E-B-E unit illustrated in FIG. 7 has coils 705 and 707 for generating a magnetic field B4 respectively wound around the electrodes 302 and 308 constituting the electrostatic deflector 207 (first electric field layer). Furthermore, coils 707 and 708 are respectively wound around the electrodes 304 and 309 constituting the electrostatic deflector 208 (second electric field layer).

As described above and illustrated in FIG. 7, according to the configuration of generating the electric field in the same direction as the magnetic field generated by the E-B-E unit and generating the magnetic field in the same direction as the electric field generated by the E-B-E unit, it is possible to correct an axial misalignment of the beam in a depth direction of the page.

Moreover, with the configuration as illustrated in FIG. 7, the magnetic pole constituting the magnetic field layer and the electrodes constituting the electric field layers are arranged close to one another, and it is contemplated that a path of a magnetic flux is formed through which the magnetic field B2 passes through the upper and lower electrodes and returns to the magnetic pole. The unwanted deflection effect with the upper and lower electrostatic deflectors caused by such a magnetic flux can be offset by the magnetic field B4 or a magnetic field B5. It is possible to retain uniformity of the magnetic field in the gap between the electrodes of the upper and lower electrostatic deflectors.

<Configuration Example of Electron Gun Including E-B-E Unit>

Figure 9:
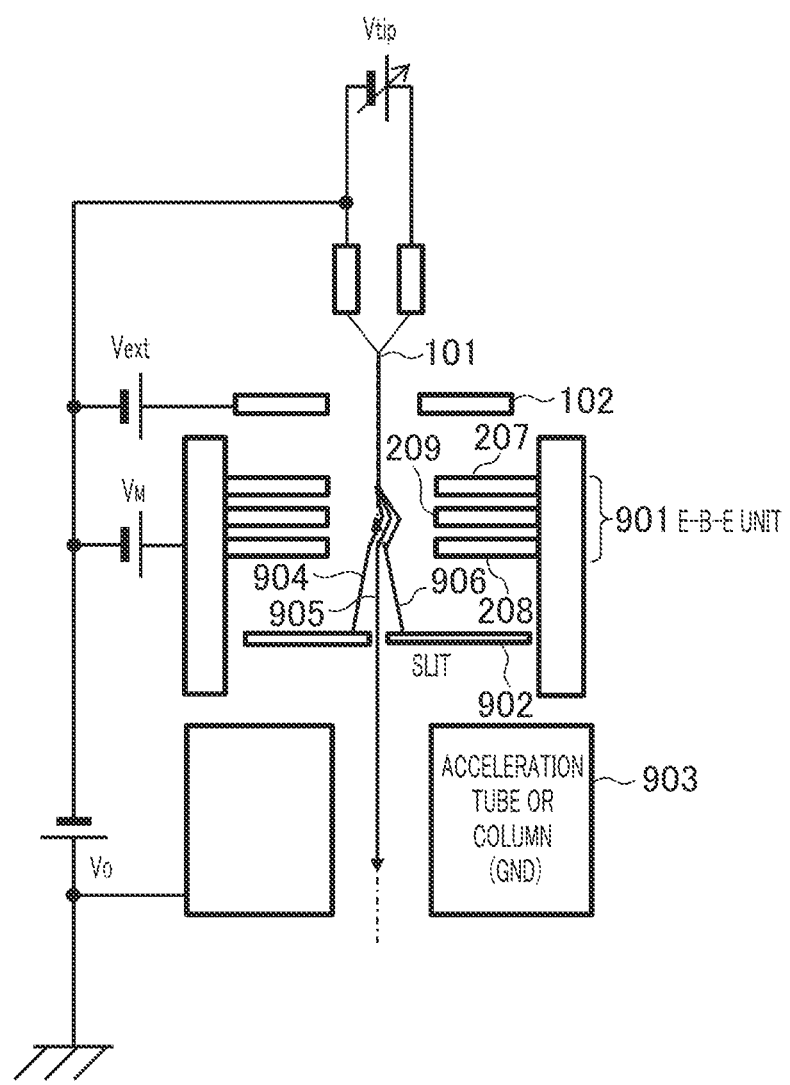
FIG. 9 shows a configuration example of an electron gun including an E-B-E unit according to the present embodiment.

There is described an example of adopting the E-B-E unit that is the deflector of the beam described above as another optical element of the electron microscope. FIG. 9 shows an example of an electron gun including the above-described E-B-E unit. Electrons extracted from the tip 101 by an anode (extraction electrode 102) are accelerated by an acceleration tube 903 and impinge on an unshown sample.

The electron gun illustrated in FIG. 9 includes a monochromator including an E-B-E unit 901. The monochromator is a device that makes a beam monochromatic, and it is used for the purpose of removing electrons having undesired energy from the beam by dispersing energy of the beam and selectively passing a beam having certain energy using a slit 902 or the like.

In the electron gun illustrated in FIG. 9, the E-B-E unit 901 is used as a means of energy dispersion. The E-B-E unit 901 includes the electrostatic deflector 207, the magnetic field deflector 209, and the electrostatic deflector 208, and disperses energy of the beam by the deflection effect of each deflector. As illustrated in FIG. 9, while an electron 905 having desired energy passes through the slit 902 formed in a slit forming member, an electron 906 having lower energy than the desired energy and an electron 904 having higher energy than the desired energy are blocked by the slit forming member.

Electrons having passed through the slit are accelerated by the acceleration tube 903 (or acceleration electrode or electron microscope column at ground potential) and impinge on the sample as an electron beam. The tip 101 is applied with a voltage Vtip for heating the tip 101. Moreover, the extraction electrode 102 is applied with a voltage Vext according to an extraction quantity of electrons.

Furthermore, the E-B-E unit 901 is biased with a voltage $V_M$, and an electrostatic lens is configured by a potential difference from Vext. In a case of the present embodiment, the electrostatic lens formed between the extraction electrode 102 and the E-B-E unit 901 is used as a deceleration lens by setting Vext>$V_M$. It is to be noted that another electrode may be arranged between the extraction electrode 102 and the E-B-E unit 901 for applying voltage to form the electrostatic lens between itself and the E-B-E unit 901. The electron 905 selected by the slit 902 is accelerated by the acceleration tube 903 provided with the potential difference by a voltage $V_o$ with respect to the tip, and impinged on the sample.

By adjusting the electrostatic lens formed on the E-B-E unit 901 to focus on the slit 902, it is possible to achieve high monochromatization.

<Configuration Example of Monochromator Including E-B-E Unit>

Figure 10:
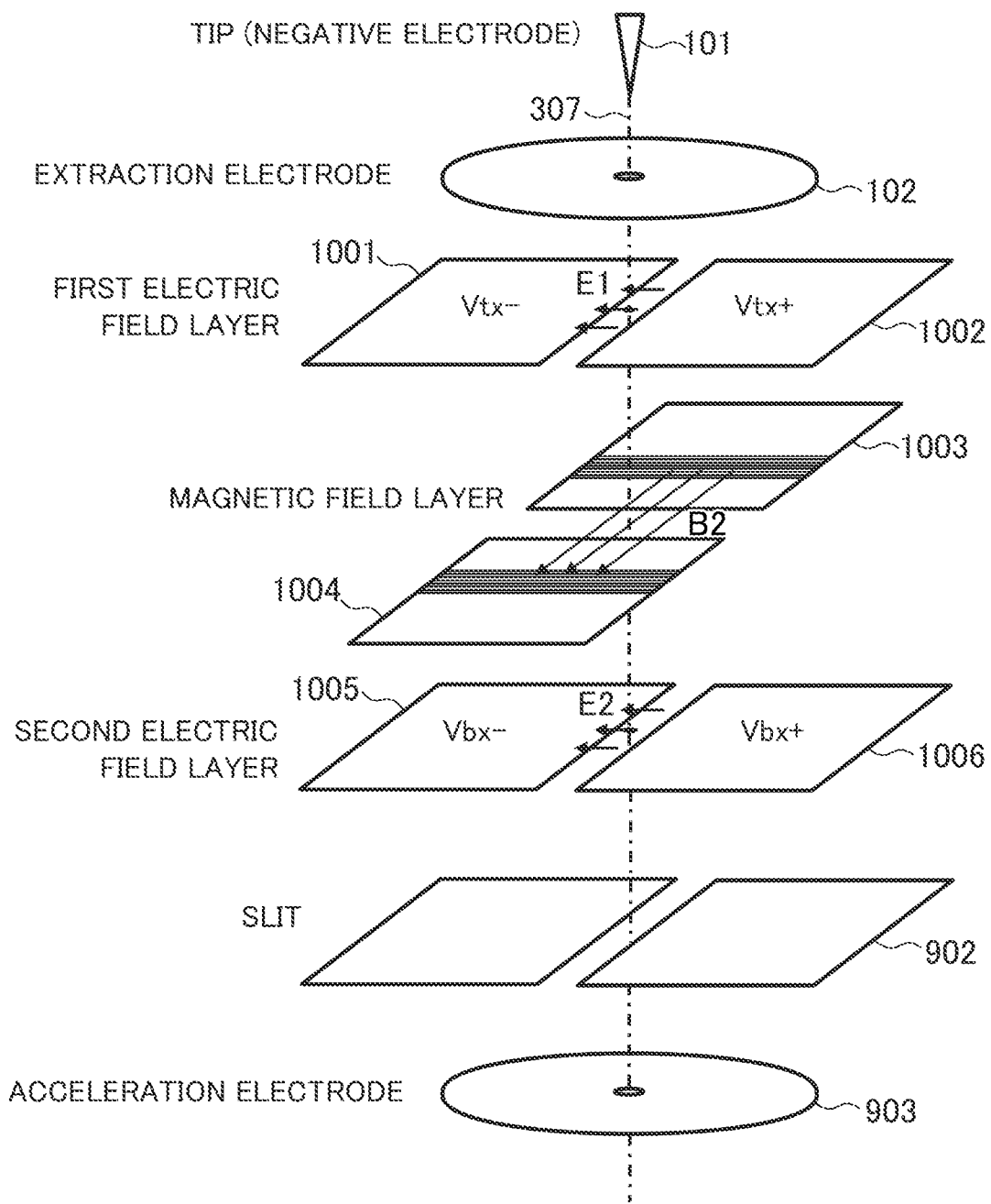
FIG. 10 illustrates an operation outline of a monochromator including the orthogonal electromagnetic field generation unit.

FIG. 10 shows a schematic configuration example of the monochromator including the E-B-E unit. As illustrated in FIG. 10, the first electric field layer (electrostatic deflector 207) including the extraction electrode 102 and electrodes 1001 and 1002, the magnetic field layer (magnetic field deflector 209) including magnetic poles 1003 and 1004, the second electric field layer (electrostatic deflector 208) including electrodes 1005 and 1006, the slit 902, and the acceleration tube (acceleration electrode) 903 are stacked.

As illustrated in FIG. 10, by stacking the electrodes and the magnetic poles so as to partially overlap one another while securing the beam passage trajectory 307, it is possible to easily arrange the optical element required by the monochromator even in such a limited space as that surrounding the electron gun.

<Positional Relation Between a Pair of Electrodes 302 and 308 Constituting Electrostatic Deflector (First Electrostatic Deflector) and a Pair of Magnetic Poles 701 and 702 Constituting Magnetic Field Deflector>

Figure 11:
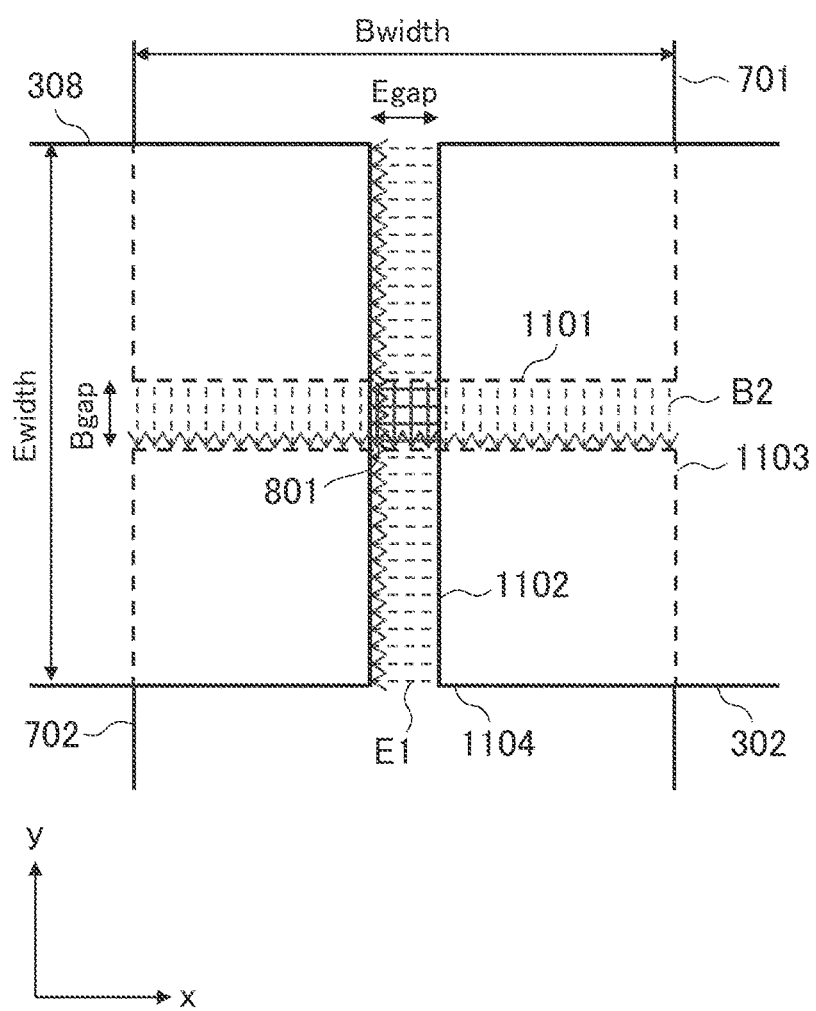
FIG. 11 shows a positional relation between a pair of electrodes constituting an electrostatic deflector and a pair of magnetic poles constituting a magnetic field deflector.

FIG. 11 shows a positional relation between a pair of the electrodes 302 and 308 constituting the electrostatic deflector (first electrostatic deflector) and a pair of the magnetic poles 701 and 702 constituting the magnetic field deflector. It is to be noted that, while the above-described E-B-E unit is constituted by three stages of deflectors in total including the electrostatic deflector (first electrostatic deflector), the magnetic field deflector, and the electrostatic deflector (second electrostatic deflector), more than three stages of deflectors may be stacked as long as the deflection effect of the electrostatic deflector is adjusted to offset the deflection effect of the magnetic field deflector. Moreover, a B-E-B unit may be used including the magnetic field deflector, the electrostatic deflector, and the magnetic field deflector stacked in this order from the top.

The pair of electrodes 302 and 308 is arranged facing each other with a beam optical axis between them (arranged in an x direction in the example shown in FIG. 11). Both electrodes are spaced by Egap as a space for generating the electric field E1.

On the other hand, the pair of magnetic poles 701 and 702 is arranged facing each other with a beam optical axis between them (arranged in a y direction in the example shown in FIG. 11). Both electrodes are spaced by Bgap as a space for generating the magnetic field B2.

By arranging an array direction of the electrodes (opposite direction) and an array direction of the magnetic pole to be orthogonal to each other, the E-B-E unit can generate an orthogonal electromagnetic field. Moreover, the pair of electrodes 302 and 308 and the pair of magnetic poles 701 and 702 are stacked along the beam trajectory so as to partially overlap as seen from the z direction (incident direction of the beam). Furthermore, the pair of electrodes 302 and 308 is installed to overlap the gap between the pair of magnetic poles 701 and 702 as well. The pair of magnetic poles 701 and 702 is also installed to overlap the gap between the pair of electrodes 302 and 308.

Furthermore, the electrodes 302 and 308 are installed so that Egap is narrower (smaller) than a width Bwidth of the magnetic poles 701 and 702 (a dimension (dimension of an opposite surface 1101 in the x direction) in a direction (x direction) orthogonal to the opposite direction of the two magnet poles (y direction) and the passing direction of the beam (z direction)).

Moreover, the magnetic poles 701 and 702 are installed so that Bgap is narrower (smaller) than a width Ewidth of the electrodes 302 and 308 (a dimension (dimension of an opposite surface 1102 in the y direction) in a direction (y direction) orthogonal to the opposite direction of the two magnet poles (x direction) and the z direction).

As described above, the gap is formed between the electrodes and between the magnetic poles while allowing overlaps between the electrodes and the magnetic poles as seen from the z direction, and a portion superimposed by the gap between the electrodes and the gap between the magnetic poles is a beam passage aperture 701. This makes it possible to bring the electrodes and the magnetic poles close to the beam trajectory with a relatively simple configuration.

If ever attempting to bring the electrodes and the magnetic poles closer to the beam trajectory while providing the electrodes and the magnetic poles at the same height, it would be required to arrange a pair of electrodes and a pair of magnetic poles around the beam passage aperture 701 in a non-contact and axisymmetric manner. That is, the closer the electrodes and the magnetic poles are brought to the beam trajectory, the smaller the electrodes and the magnetic poles must be made, which consequently requires a high processing accuracy.

On the other hand, the configuration illustrated in FIG. 11 makes it possible to bring the electrodes and the magnetic poles close to the beam trajectory relatively easily and to form the orthogonal electromagnetic field including the electric field and the magnetic field that are highly uniform. Moreover, the configuration including stacked plate-like bodies makes it possible to reduce a deflection element in size and thus to easily house an optical element as a deflector in a limited space like the inside of the electron gun.

Moreover, as illustrated in FIG. 11, by making Bwidth larger than Bgap (a region where the deflection magnetic field is formed) (e.g., Bwidth≥2×Bgap is possible), it is possible to sufficiently space between a magnetic pole end 1103 and the beam trajectory. Furthermore, by making Ewidth larger than Egap (a region where the deflection electric field is formed) (e.g., Ewidth≥2×Egap is possible), it is possible to sufficiently space between an electrode end 1104 and the beam trajectory.

The configuration including the electrodes and the magnetic poles partially overlapping one another as illustrated in FIG. 11 makes it possible to sufficiently increase the width of the magnetic pole (electrode) and increase the distance between the magnetic pole end (magnetic pole end) and the beam trajectory. This makes it possible to suppress the influence of disturbance of the magnetic field (electric field) generated at the magnetic pole end (electrode end) on the beam.

<Charged Particle Beam Device Including a Plurality of E-B-E Units>

Figure 12:
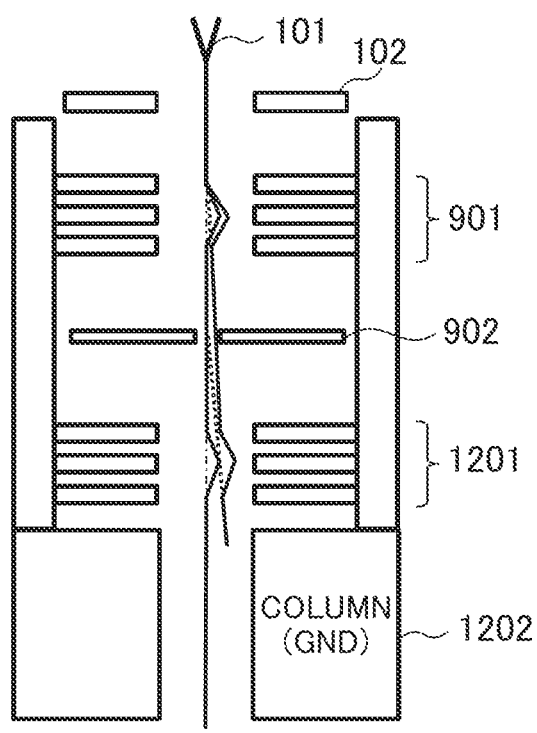
FIG. 12 illustrates an operation outline of the monochromator including two orthogonal electromagnetic field generation units.

Now, there is described a charged particle beam device including a plurality of E-B-E units. FIG. 12 shows an example of the charged particle beam device including a second E-B-E unit 1201 in addition to the above-described E-B-E unit (first E-B-E unit 901). An electron microscope column 1202 is grounded and accelerates the beam by the potential difference from the tip 101.

Figure 13:
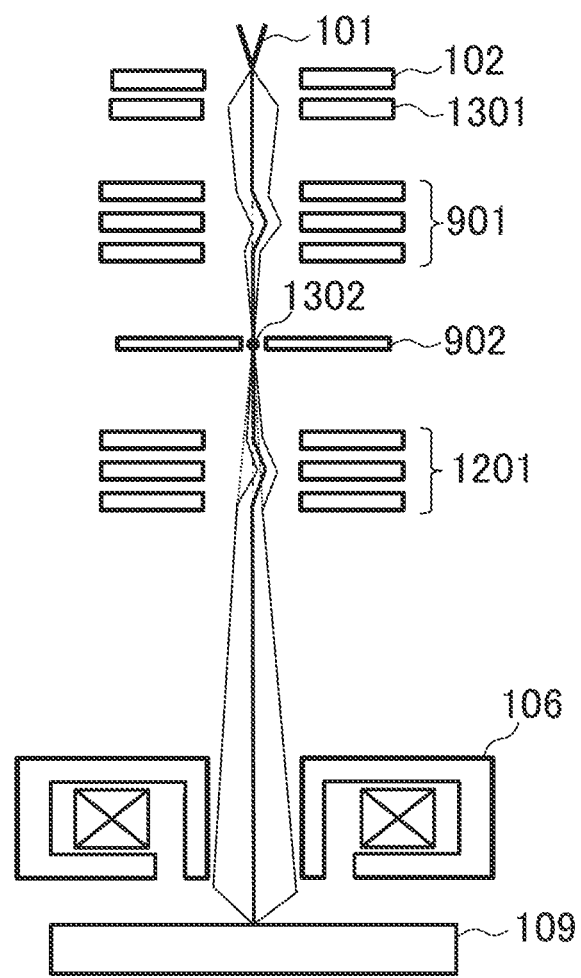
FIG. 13 shows a configuration example of a charged particle beam device including two orthogonal electromagnetic field generation units.

FIG. 13 illustrates the configuration of the charged particle beam device illustrated in FIG. 12 in more detail. As illustrated in FIG. 13, a focusing electrode (focusing lens) 1301 is configured to focus the beam emitted from the tip 101 on the slit 902. Moreover, the optical system illustrated in FIG. 13 is configured so that a crossover 1302 is an object point of the objective lens 106.

FIG. 14 shows an optical system that corrects the chromatic aberration generated by electrons having undesired energy among the electrons having passed through the slit 902 using the second E-B-E unit 1201. In the optical system illustrated in FIG. 14, the distance between the electrode and the magnetic pole included in the first E-B-E unit 901 and the distance between the electrode and the magnetic pole included in the second E-B-E unit 1201 coincide with each other (distance L). Moreover, the distance between the first E-B-E unit 901 and the slit 902 and the distance between the second E-B-E unit 1201 and the slit 902 also coincide with each other (distance S). That is, the first E-B-E unit 901 and the second E-B-E unit 1201 are arranged plane-symmetrically with respect to the slit 902 as a symmetry plane.

Figure 14A:
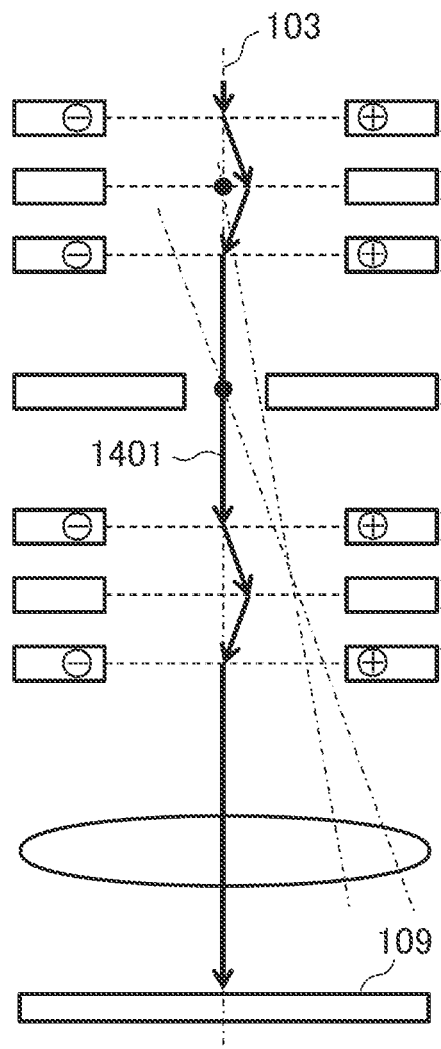
FIGS. 14A and 14B illustrate an optical system that corrects a chromatic aberration generated by electrons having undesired energy.

The first E-B-E unit 901 disperses energy of the beam by two deflections and selectively passes an electron 1401 having predetermined energy using the slit 902. FIG. 14(a) shows a trajectory of the electron 1401 having original energy Vc of the beam (voltage applied between the tip and the acceleration electrode). Since the second E-B-E unit 1201 is adjusted to deflect the beam under the same condition as that of the first E-B-E unit 901, the electron 1401 reaches the sample 109 as it was when it passed the ideal optical axis 103.

Figure 14B:
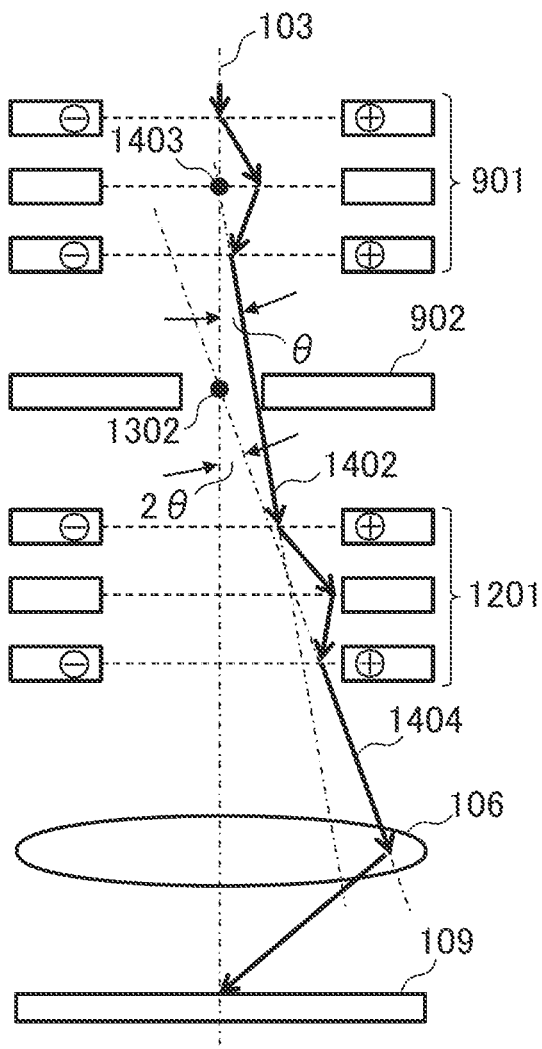

On the other hand, electrons having passed through the slit 902 may include an electron having energy of Vc±α (e.g., α is 0.1 eV-0.5 eV). FIG. 14(b) shows a trajectory of an electron 1402 having energy of (Vc−α) eV that passes through the slit 902. The electron 1402 would reach the sample 109 in a state where it is out of the ideal optical axis 103, which can be a factor of generating the chromatic aberration. Hence, by deflecting the trajectory of the electron 1402 so that electrons appear to be emitted from the cross-over 1302 (object point of the objective lens 106) (as if the beam diverges at the crossover 1302) using the second E-B-E unit 1201, it is possible to focus the beam at one point on the sample 109 regardless of energy difference.

Since the second E-B-E unit 1201 deflects the electron 1402 emitted from a virtual light source 1403 and having a relative angle θ to ideal optical axis 103 under the same condition as that of the first E-B-E unit 901, a relative angle of an electron 1404 deflected by the second E-B-E unit 1201 to the ideal optical axis 10 is 2θ. By adjusting the deflection condition (deflection angle θ) of the two E-B-E units to be as shown in FIG. 14, it is possible to compensate for the chromatic aberration to a relatively high degree as compared with a single-stage E-B-E unit. Since electrons emitted from an objective lens object point (crossover 1302) and collected by the objective lens will reach the same point on the sample regardless of their emission directions, it is possible to compensate for the chromatic aberration (dispersion).

It is to be noted that, although the above-described example illustrates the configuration in which the two E-B-E units are plane-symmetric with respect to the slit, it is possible to align an originating point of the chromatic dispersion with the crossover by adjusting voltage and current supplied to the E-B-E unit without arranging them in plane symmetry. That is, it is possible to achieve advanced aberration correction by an adjustment to align the originating point of the chromatic dispersion (an apparent emission point common to the electrons 1401, 1404) with the objective lens object point.

<Other Configuration Examples of Charged Particle Beam Device Including a Plurality of E-B-E Unit>

Figure 15:
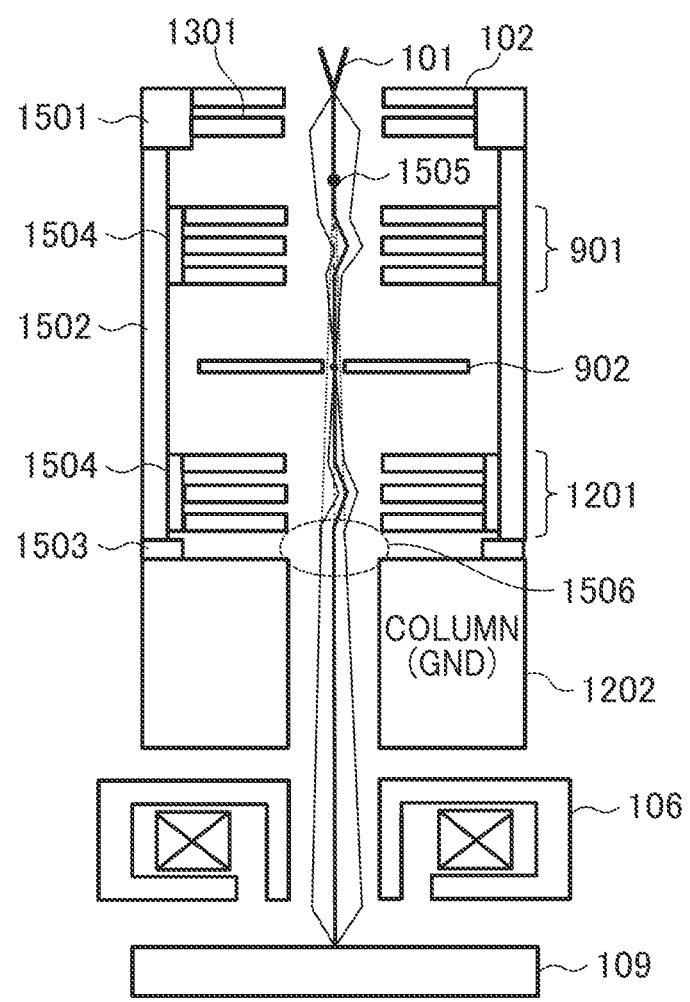
FIG. 15 shows a configuration example of the charged particle beam device including a deceleration electrode surrounding two orthogonal electromagnetic field generation units.

FIG. 15 shows another example of the charged particle beam device including a plurality of E-B-E units. A configuration illustrated in FIG. 15 can improve an effect of generating the chromatic dispersion on the passing beam by arranging two E-B-E units in a deceleration region of the beam. The lower the beam energy is, the larger the deflection angle of the beam is made by the magnetic field deflector and the electrostatic deflector, and consequently the larger the chromatic dispersion is.

Now, the charged particle beam device illustrated in FIG. 15 forms the deceleration region between the focusing electrode (focusing lens) 1301 and the electron microscope column 1202 by surrounding the two E-B-E units by a deceleration electrode 1502 applied with negative voltage. Insulators 1501, 1503, 1504 are arranged between the deceleration electrode 1502 that is a deceleration region forming member and electrodes and the like constituting the E-B-E unit, and the deceleration electrode 1502 is floating.

In the configuration illustrated in FIG. 15, the focusing electrode (focusing lens) 1301 focuses the beam on the slit 902 (crossover 1302). By supplying voltage and current to the E-B-E units 901 and 1201 in a plane-symmetric manner with respect to the slit 902 as with the example shown in FIGS. 12 to 14, it is possible to block the electrons having undesired energy.

However, since a region 1506 is located between the deceleration electrode 1502 and the electron microscope column 1202, the electrostatic lens is formed by the potential difference between the negative voltage applied to the deceleration electrode 1502 and the ground potential of the electron microscope column 1202. Since the beam trajectory is focused by the electrostatic lens, the position of the object point as seen from the objective lens 106 is offset from the crossover 1302 to a position 1505 (virtual object point 1505). Therefore, the objective lens 106 must be provided with voltage and current to form an image on the sample 109 with electrons emitted from the virtual object point 1505.

Moreover, although the objective lens 106 is arranged at a latter stage of the two-stage E-B-E unit in the example shown in FIGS. 12 to 15, a diaphragm may be arranged between the E-B-E unit and the objective lens, or one or more detectors or deflectors may be arranged. Moreover, a plurality of crossovers may be formed by arranging a plurality of condenser lenses between the E-B-E unit and the objective lens.

<Configuration Example of E-B-E Unit that Suppresses Magnetic Field Leakage>

Figure 16A:
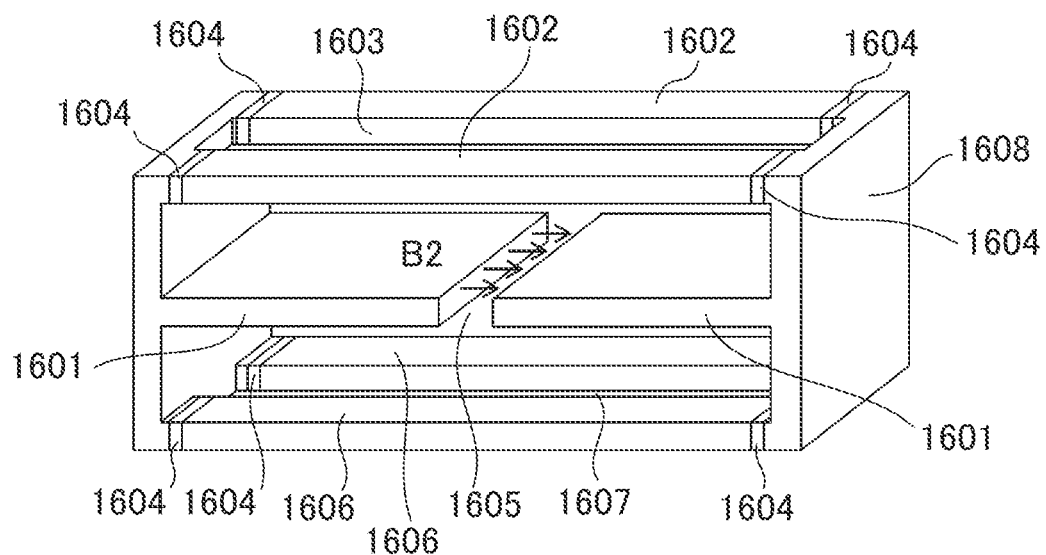
FIGS. 16A and 16B show a configuration example of the E-B-E unit that prevents leakage of the magnetic field to the outside.
Figure 16B:
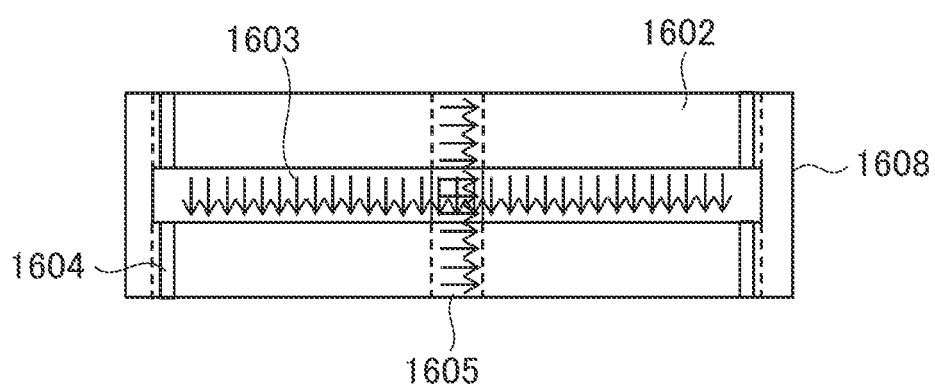

FIG. 16 shows a configuration example of an E-B-E unit that suppresses leakage of the magnetic field to the outside. FIG. 16(a) shows a pair of magnetic poles and a closed magnetic circuit in the E-B-E unit. FIG. 16(b) is a view of the closed magnetic circuit in FIG. 16(a) as seen from the beam irradiation direction.

With reference to FIG. 16(a), the referenced E-B-E unit includes a pair of magnet poles 1601 for generating the magnetic field B2 and a plurality of magnetic bodies 1602, 1606, and 1608 that constitute the closed magnetic circuit for suppressing an effect of the magnetic field B2 on other portions of the beam. Here, the magnetic body 1608 is configured to support the pair of magnet poles 1601 and the magnetic body 1602. Moreover, spaces 1603 and 1607 ("beam passage aperture") for passing the beam are formed between the shown pair of magnetic bodies 1602 and between the pair of magnetic bodies 1606, respectively. It is to be noted that the magnetic bodies 1602 and 1606 and the magnetic body 1608 are configured to couple to one another via an insulating material 1604. Moreover, the magnetic pole 1601, the magnetic bodies 1602 and 1606, and the magnetic body 1608 that constitute the closed magnetic circuit can be made of, for example, soft magnetic bodies.

The magnetic bodies 1602 and 1606 per se are electrodes that constitute the E-B-E unit. In this case, as shown in FIG. 16(b), the above-described electric field E1 (see FIG. 10) is generated in the space (beam passage aperture) 1603 between the pair of magnet bodies 1602 serving as electrodes. Moreover, although not shown in FIG. 16(b), the above-described electric field E2 (FIG. 10) is also generated in a space (beam passage aperture) 1605 between the pair of magnet bodies 1606 serving as electrodes. Moreover, a portion of the magnetic body 1602 constituting the closed magnetic circuit is arranged to overlap the pair of magnet poles 1601 (to over a portion of the pair of magnet poles 1601 without contact therewith) as seen from the incident direction of the beam.

It is to be noted that the magnetic bodies 1602 and 1606 per se may not be configured as electrodes. In this case, a pair of electrodes may be arranged away from the magnetic bodies 1602 and 1606 as components of the E-B-E unit. For example, the electrodes may be arranged using a predetermined support member between the magnetic bodies 1602 and 1606 and the magnetic pole 1601, or an insulating material may be attached (applied) to side faces of the magnetic bodies 1602 and 1606 via which the electrodes may be installed. At this time, since the magnetic bodies 1602 and 1606 per se are not used as the electrodes, the above-described insulating material 1604 is not required.

Figure 17:
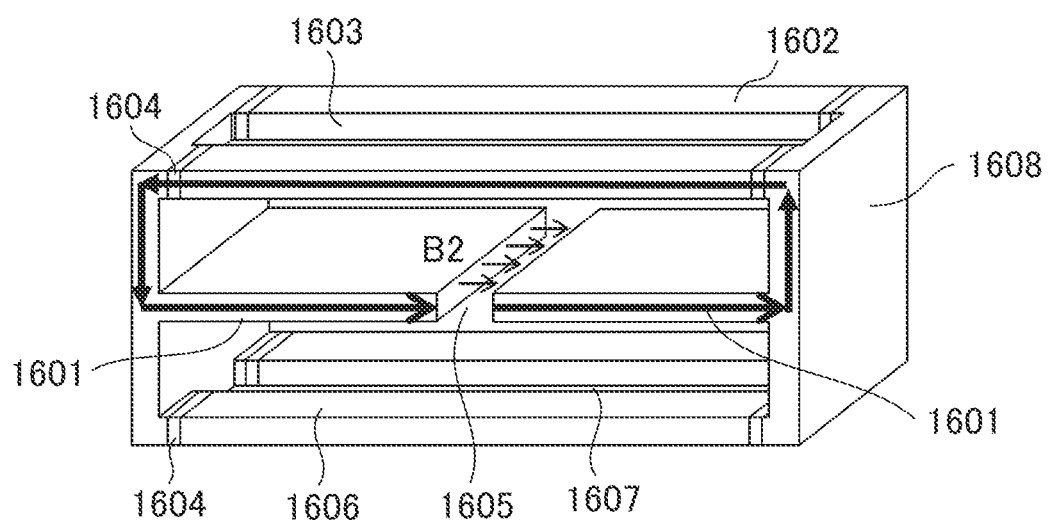
FIG. 17 shows a flow (example) of the magnetic field (magnetic flux) generated in a closed magnetic circuit.

FIG. 17 shows a flow (example) of the magnetic field (magnetic flux) generated in the closed magnetic circuit. The magnetic field generated in the closed magnetic circuit, as shown in FIG. 17, passes through the referenced circuit through a passage of the magnetic body 1602→the magnetic body 1608→the magnetic pole 1601→B2 (Bgap)→the magnetic pole 1601→the magnetic body 1608→the magnetic body 1602→ . . . . It is to be noted that, while FIG. 17 shows only the flow of the magnetic field of the closed magnetic circuit on the upper side, the closed magnetic circuit on the lower side (closed magnetic circuit constituted by the magnetic body 1606, the magnetic body 1608, and the magnetic pole 1601) also has a similar flow of the magnetic field.

By configuring the closed magnetic circuit in this manner, it is possible to suppress leakage of the magnetic field (magnetic field) to the outside of the E-B-E unit.

LIST OF REFERENCE SIGNS

101: Tip
102: Extraction electrode
103: Ideal optical axis
104: Condenser lens
105: Scanning deflector
106: Objective lens
107: Vacuum sample chamber
108: Sample stage
109: Sample
110: Electron
111: Secondary electron
112: Conversion electrode
113: Detector
114: Control device

What is claimed is:

1. A beam deflection device for deflecting a beam in a charged particle beam device, comprising:
   one or more electrostatic deflectors including a pair of electrodes arranged to sandwich therebetween a trajectory of the beam in a first direction orthogonal to the trajectory of the beam; and
   one or more magnetic field deflectors including a pair of magnetic poles arranged to sandwich therebetween the trajectory of the beam in a second direction orthogonal to the trajectory of the beam and the first direction,
   wherein the one or more electrostatic deflectors and the one or more magnetic field deflectors are stacked along the trajectory of the beam so that at least a portion of the pair of electrodes overlap the pair of magnetic poles as seen from an incident direction of the beam, and
   wherein each of the pair of electrodes and each of the pair of magnetic poles comprises a flat body.

2. The beam deflection device according to claim 1,
   wherein Bwidth that is a dimension of the magnetic poles orthogonal to the beam is equal to or larger than two times of Bgap that is a dimension of a gap between the pair of magnetic poles.

3. The beam deflection device according to claim 1,
wherein Ewidth that is a dimension of the electrodes orthogonal to the beam is equal to or larger than two times of Egap that is a dimension of a gap between the pair of electrodes.

4. The beam deflection device according to claim 1,
wherein, the one or more electrostatic deflectors and the one or more magnetic field deflectors are stacked so that, as seen from the incident direction of the beam,
a first superimposed portion is located between a first electrode included in the pair of electrodes and a first magnetic pole included in the pair of magnetic poles,
a second superimposed portion is located between the first electrode and a second magnetic pole included in the pair of magnetic poles,
a third superimposed portion is located between a second electrode included in the pair of electrodes and the first magnetic pole, and
a fourth superimposed portion is located between the second electrode and the second magnetic pole.

5. The beam deflection device according to claim 1,
wherein the electrostatic deflector is configured to deflect the beam to a direction opposite from a deflection direction of the magnetic field deflector with respect to the beam and to compensate for deflection of the magnetic field deflector.

6. The beam deflection device according to claim 1,
wherein the pair of magnetic poles is connected to a frame constituted by a magnetic material, and the referenced pair of magnetic poles and the frame constitute a closed magnetic circuit.

7. The beam deflection device according to claim 6,
wherein the pair of electrodes is constituted by magnetic bodies and constitutes a portion of the magnetic circuit.

8. The beam deflection device according to claim 7,
wherein the pair of magnetic poles is electrically insulated from each other, and has respective electric potentials so as to allow for formation of an electric field parallel to a magnetic field generated between the referenced pair of magnetic poles.

9. The beam deflection device according to claim 7,
wherein the pair of electrodes is magnetically insulated from each other, and configured to form a magnetic field parallel to an electric field generated between the referenced pair of electrodes.

10. The beam deflection device according to claim 1,
wherein the one or more electrostatic deflectors and the one or more magnetic field deflectors are arranged between mirrors of an aberration corrector of a double mirror type in the charged particle beam device, and the referenced one or more electrostatic deflectors and the one or more magnetic field deflectors are configured to direct the beam deflected from an optical axis of the charged particle beam device toward one mirror of the aberration corrector of the double mirror type, direct the beam reflected by the referenced one mirror toward an other mirror of the aberration corrector of the double mirror type, and direct the mirror reflected by the other mirror toward the optical axis of the charged particle beam device.

11. The beam deflection device according to claim 1,
further comprising:
a slit forming member having a slit formed therein that limits passage of a portion of the beam having passed through the one or more electrostatic deflectors and the one or more magnetic field deflectors, wherein the slit forming member is configured to selectively pass a beam having certain energy among the beams having passed through the one or more electrostatic deflectors and the one or more magnetic field deflectors.

12. A charged particle beam device comprising the beam deflection device according to claim 1.

13. An aberration corrector, comprising:
the beam deflection device according to claim 1;
first and second mirrors each including a beam reflection surface, at least one of the first and second mirrors being configured to provide the beam with aberration correction;
an intermediate space located between the referenced first mirror and second mirror and having the beam deflection device arranged therein;
a former-stage deflector configured to deflect a beam emitted from a beam source that emits a beam along a first trajectory toward the beam deflection device; and
a latter-stage deflector that deflects the beam reflected by the first and second mirrors and deflected by the beam deflection device to be along the first trajectory.

14. A monochromator, comprising:
the beam deflection device according to claim 1; and
a slit forming member having a slit formed therein that limits passage of a portion of the beam, the slit forming member including a first portion disposed on a first side of the slit and a second portion disposed on a second side of the slit that is opposite from the first side,
wherein the beam deflection device is configured to disperse energy of the beam before impinging on the slit.

15. The monochromator according to claim 14, further comprising:
an objective lens that focuses the beam; and
an orthogonal electromagnetic field generation unit arranged between the first portion and the second portion of the slit forming member,
wherein the orthogonal electromagnetic field generation unit is configured to deflect the beam so that the beam appears to be dispersed at an object point of the objective lens.

16. The monochromator according to claim 14, further comprising:
an objective lens that focuses the beam; and
an orthogonal electromagnetic field generation unit arranged between the first portion and the second portion of the slit forming member,
wherein the orthogonal electromagnetic field generation unit deflects the beam so as to compensate for dispersion occurring in the beam deflection device.

17. The monochromator according to claim 14, further comprising:
a deceleration region forming member that surrounds the beam deflection device and decelerates the beam.

18. The beam deflection device according to claim 1,
further comprising:
a magnetic material that constitute a closed magnetic circuit along with the pair of magnetic poles,
wherein at least a portion of the referenced magnetic material is configured to overlap the pair of magnetic poles as seen from an incident direction of the beam.

19. The beam deflection device according to claim 18,
wherein the closed magnetic circuit includes a support part constituted by a magnetic body that supports the pair of magnetic poles, and
wherein the support part and the magnetic material are connected to each other via an insulating material.

20. The beam deflection device according to claim 19, wherein the magnetic material constitutes the pair of electrodes.

21. The beam deflection device according to claim 18, wherein the pair of electrodes are attached to the closed magnetic circuit as spaced from the magnetic material or via an insulating layer.

22. The beam deflection device according to claim 18, wherein the closed magnetic circuit is constituted by a soft magnetic body.

23. A charged particle beam device comprising:
a charged particle beam column including an optical element for irradiating a sample with a beam; and
the beam deflection device according to claim 1.

* * * * *